United States Patent
Chindalore et al.

(10) Patent No.: US 7,399,675 B2
(45) Date of Patent: Jul. 15, 2008

(54) ELECTRONIC DEVICE INCLUDING AN ARRAY AND PROCESS FOR FORMING THE SAME

(75) Inventors: Gowrishankar L. Chindalore, Austin, TX (US); Craig T. Swift, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 393 days.

(21) Appl. No.: 11/079,674

(22) Filed: Mar. 14, 2005

(65) Prior Publication Data

US 2006/0076609 A1   Apr. 13, 2006

Related U.S. Application Data

(63) Continuation-in-part of application No. 10/961,295, filed on Oct. 8, 2004.

(51) Int. Cl.
*H01L 21/336* (2006.01)

(52) U.S. Cl. .............. 438/266; 257/E21.679; 257/202; 438/201; 438/211; 438/257; 438/183; 438/321; 438/926

(58) Field of Classification Search ........ 438/201, 438/211, 591, 257, 266, 183, 321, 926; 257/202, 257/E21.679
See application file for complete search history.

(56) References Cited

U.S. PATENT DOCUMENTS

| | | | |
|---|---|---|---|
| 4,184,207 A | 1/1980 | McElroy | |
| 4,751,558 A | 6/1988 | Kenney | |
| 4,785,337 A | 11/1988 | Kenney | |
| 4,833,094 A | 5/1989 | Kenney | |
| 4,860,070 A | 8/1989 | Arimoto et al. | |
| 5,196,722 A | 3/1993 | Bergendahl et al. | |
| 5,252,845 A | 10/1993 | Kim et al. | |
| 5,315,142 A | 5/1994 | Acovic et al. | |
| 5,411,905 A * | 5/1995 | Acovic et al. | 438/156 |
| 5,432,365 A | 7/1995 | Chin et al. | |
| 5,567,635 A | 10/1996 | Acovic et al. | |
| 5,705,415 A | 1/1998 | Orlowski et al. | |
| 5,721,448 A | 2/1998 | Hauf et al. | |
| 5,786,612 A * | 7/1998 | Otani et al. | 257/316 |
| 5,801,415 A * | 9/1998 | Lee et al. | 257/316 |
| 5,824,580 A | 10/1998 | Hauf et al. | |
| 5,907,775 A * | 5/1999 | Tseng | 438/261 |

(Continued)

OTHER PUBLICATIONS

U.S. Appl. No. 10/961,295, filed Oct. 8, 2004.

(Continued)

*Primary Examiner*—Matthew S. Smith
*Assistant Examiner*—Jarrett J Stark

(57) ABSTRACT

An electronic device can include an NVM array, wherein portions of word lines are formed within trenches. Insulating features are formed over heavily doped regions within the substrate. In one embodiment, charge storage stacks and a control gate electrode layer can be formed and substantially fill the trench. The insulating features help to reduce capacitive coupling between the heavily doped regions and the control gate electrode layer. In a particular embodiment, the insulating features are recessed from a top surface of a layer outside the trenches. The control gate electrode layer can form a substantially continuous electrical path along the lengths of the word lines. This particular embodiment substantially eliminates the formation of stringers or other residual etching artifacts from the control gate electrode layer within the array. A process can be performed to form the electronic device.

11 Claims, 8 Drawing Sheets

U.S. PATENT DOCUMENTS

| | | | |
|---|---|---|---|
| 5,914,523 | A | 6/1999 | Bashir et al. |
| 5,923,046 | A | 7/1999 | Tezuka et al. |
| 5,969,383 | A | 10/1999 | Chang et al. |
| 5,998,263 | A | 12/1999 | Sekariapuram et al. |
| 6,074,954 | A | 6/2000 | Lill et al. |
| 6,117,733 | A | 9/2000 | Sung et al. |
| 6,121,148 | A | 9/2000 | Bashir et al. |
| 6,133,601 | A * | 10/2000 | Watanabe .................... 257/314 |
| 6,228,706 | B1 | 5/2001 | Horak et al. |
| 6,265,268 | B1 | 7/2001 | Halliyal et al. |
| 6,281,064 | B1 | 8/2001 | Mandelman et al. |
| 6,287,917 | B1 * | 9/2001 | Park et al. .................... 438/262 |
| 6,307,782 | B1 | 10/2001 | Sadd et al. |
| 6,320,784 | B1 | 11/2001 | Muralidhar et al. |
| 6,330,184 | B1 | 12/2001 | White et al. |
| 6,365,452 | B1 | 4/2002 | Perng et al. |
| 6,368,916 | B1 * | 4/2002 | Nakagawa .................... 438/257 |
| 6,372,617 | B1 * | 4/2002 | Kitamura .................... 438/593 |
| 6,373,096 | B1 | 4/2002 | Hisamune et al. |
| 6,399,441 | B1 | 6/2002 | Ogura et al. |
| 6,461,905 | B1 * | 10/2002 | Wang et al. .................... 438/183 |
| 6,486,028 | B1 | 11/2002 | Chang et al. |
| 6,537,870 | B1 | 3/2003 | Shen |
| 6,544,827 | B2 * | 4/2003 | Abiko .................... 438/183 |
| 6,555,427 | B1 * | 4/2003 | Shimizu et al. .................... 438/238 |
| 6,559,032 | B2 | 5/2003 | Gonzalez et al. |
| 6,583,466 | B2 | 6/2003 | Lin et al. |
| 6,620,664 | B2 * | 9/2003 | Ma et al. .................... 438/183 |
| 6,638,810 | B2 | 10/2003 | Bakli et al. |
| 6,673,681 | B2 | 1/2004 | Kocon et al. |
| 6,674,120 | B2 | 1/2004 | Fujiwara |
| 6,677,204 | B2 | 1/2004 | Cleeves et al. |
| 6,687,156 | B2 | 2/2004 | Kobayashi et al. |
| 6,706,599 | B1 | 3/2004 | Sadd et al. |
| 6,709,922 | B2 * | 3/2004 | Ebina et al. .................... 438/257 |
| 6,734,492 | B2 | 5/2004 | Yamazaki et al. |
| 6,747,308 | B2 * | 6/2004 | Mitros et al. .................... 257/315 |
| 6,750,499 | B2 | 6/2004 | Wu |
| 6,803,620 | B2 | 10/2004 | Moriya et al. |
| 6,818,508 | B2 * | 11/2004 | Shimizu et al. .................... 438/257 |
| 6,818,512 | B1 | 11/2004 | Hsieh et al. |
| 6,818,939 | B1 | 11/2004 | Hadizad |
| 6,852,597 | B2 | 2/2005 | Park et al. |
| 6,861,315 | B1 | 3/2005 | Chen et al. |
| 6,864,540 | B1 * | 3/2005 | Divakaruni et al. .................... 257/368 |
| 6,894,339 | B2 | 5/2005 | Fan et al. |
| 6,916,715 | B2 | 7/2005 | Hsiao et al. |
| 6,936,887 | B2 | 8/2005 | Harari et al. |
| 6,958,513 | B2 | 10/2005 | Wang et al. |
| 6,998,313 | B2 | 2/2006 | Lin |
| 7,015,537 | B2 | 3/2006 | Lee et al. |
| 7,078,286 | B1 | 7/2006 | Mehta |
| 7,098,502 | B2 | 8/2006 | Mathew et al. |
| 7,122,432 | B2 * | 10/2006 | Shimizu et al. .................... 438/266 |
| 7,196,935 | B2 | 3/2007 | Forbes |
| 7,199,419 | B2 | 4/2007 | Haller |
| 7,220,634 | B2 | 5/2007 | Prall et al. |
| 7,238,599 | B2 | 7/2007 | Forbes |
| 7,244,987 | B2 | 7/2007 | Forbes |
| 2002/0093073 | A1 * | 7/2002 | Mori et al. .................... 257/510 |
| 2002/0127805 | A1 * | 9/2002 | Ebina et al. .................... 438/266 |
| 2003/0203594 | A1 * | 10/2003 | Shimizu et al. .................... 438/424 |
| 2004/0095797 | A1 | 5/2004 | Yuan et al. |
| 2004/0130941 | A1 * | 7/2004 | Kan et al. .................... 365/177 |
| 2005/0037576 | A1 * | 2/2005 | Chen et al. .................... 438/259 |
| 2005/0056895 | A1 * | 3/2005 | Shimizu et al. .................... 257/355 |
| 2005/0104120 | A1 * | 5/2005 | Ichige et al. .................... 257/315 |
| 2005/0148173 | A1 | 7/2005 | Shone |
| 2005/0242391 | A1 * | 11/2005 | She et al. .................... 257/324 |
| 2005/0280094 | A1 | 12/2005 | Forbes |
| 2006/0011966 | A1 | 1/2006 | Wang |
| 2006/0046383 | A1 | 3/2006 | Chen et al. |
| 2006/0076586 | A1 | 4/2006 | Swift et al. |
| 2006/0131640 | A1 | 6/2006 | Yu et al. |
| 2006/0166443 | A1 * | 7/2006 | Forbes .................... 438/266 |
| 2007/0018232 | A1 | 1/2007 | Chindalore et al. |

OTHER PUBLICATIONS

Van Houdt, J , et al. "An Analytical Model for the Optimization of Source-Side Injection Flash EEPROM Devices," IEEE Transactions on Electron Devices, vol. 42, No. 7, pp. 1314-1320, Jul. 1995.

Osabe, T. et al "Charge-Injection Length in Silicon Nanocrystal Memory Cells," 2004 Symposium on VLSI Technology Digest of Technical Papers p. 242-243, 2004.

Ma, Y. et al. "A Dual-Bit Split-Gate EEPROM (DSG) Cell in Contactless Array for Single-Vcc High Density Flash Memories," IEDM, p. 57-60, 1994.

Guan, H., et al. "An Analytical Model for Optimization of Programming Efficiency and Uniformity of Split Gate Source-Side Injection Superflash Memory," IEEE Transactions on Electron Devices, vol. 50, No. 3, pp. 809-815, Mar. 2003.

Hayashi, Y., et al "Twin MONOS Cell with Dual Control Gates," 2000 Symposium on VLSI Technology Digest of Technical Papers, pp. 122-123, 2000.

Lee, D , et al. "Vertical Floating-Gate 4.5F2 Split-Gate NOR Flash Memory at 110nm Node," 2004 Symposium on VLSI Technology Digest of Technical Papers, pp. 72-73, 2004.

U.S. Appl. No. 11/626,768 filed on Jan. 24, 2007.
U.S. Appl. No. 11/188,604 filed on Jul. 25, 2005.
U.S. Appl. No. 11/188,603 filed on Jul. 25, 2005.
U.S. Appl. No. 11/188,939 filed on Jul. 25, 2005.
U.S. Appl. No. 11/188,909 filed on Jul. 25, 2005.
U.S. Appl. No. 11/188,910 filed on Jul. 25, 2005.
U.S. Appl. No. 11/188,584 filed on Jul. 25, 2005.
U.S. Appl. No. 11/525,747 filed on Sep. 22, 2006.
U.S. Appl. No. 11/188,999 filed on Jul. 25, 2005.
U.S. Appl. No. 11/188,953 filed on Jul. 25, 2005.
U.S. Appl. No. 11/188,583 filed on Jul. 25, 2005.
U.S. Appl. No. 11/188,898 filed on Jul. 25, 2005.
U.S. Appl. No. 11/188,585 filed on Jul. 25, 2005.
U.S. Appl. No. 11/188,588 filed on Jul. 25, 2005.
U.S. Appl. No. 11/188,591 filed on Jul. 25, 2005.
U.S. Appl. No. 11/188,935 filed on Jul. 25, 2005.
U.S. Appl. No. 11/188,615 filed on Jul. 25, 2005.
U.S. Appl. No. 11/834,391 filed on Aug. 6, 2007.
U.S. Appl. No. 11/626,762 filed on Jan. 24, 2007.

* cited by examiner

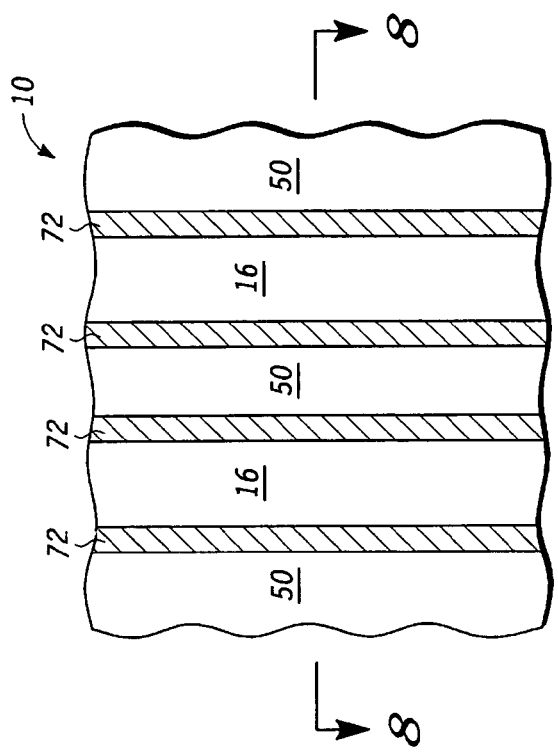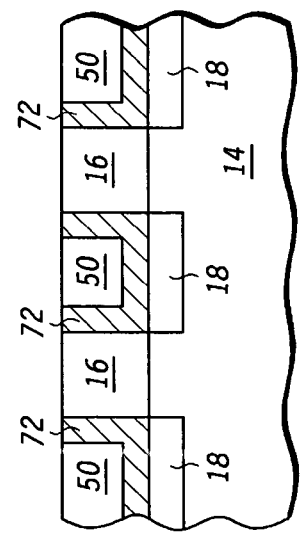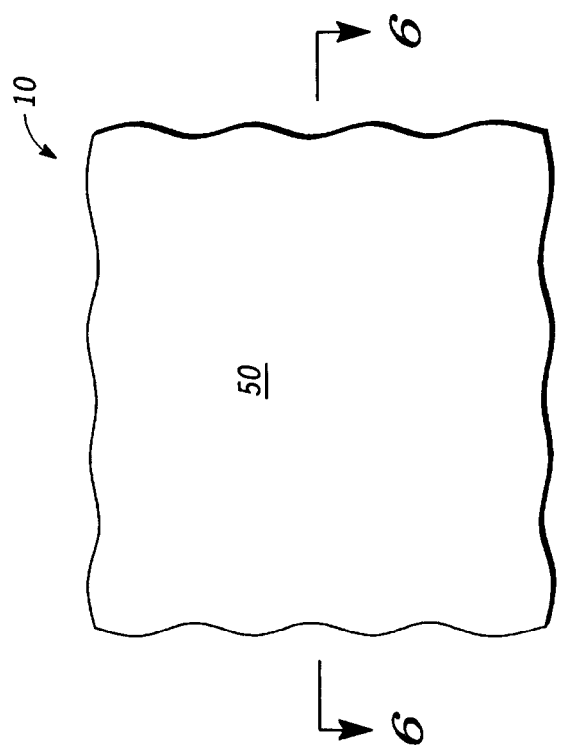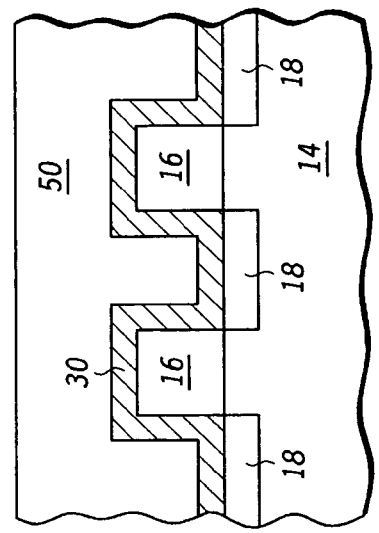

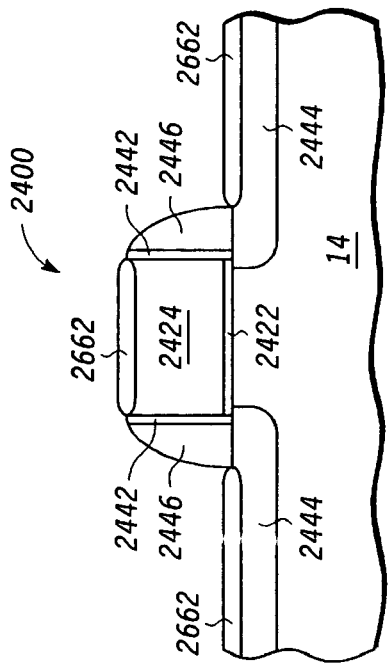
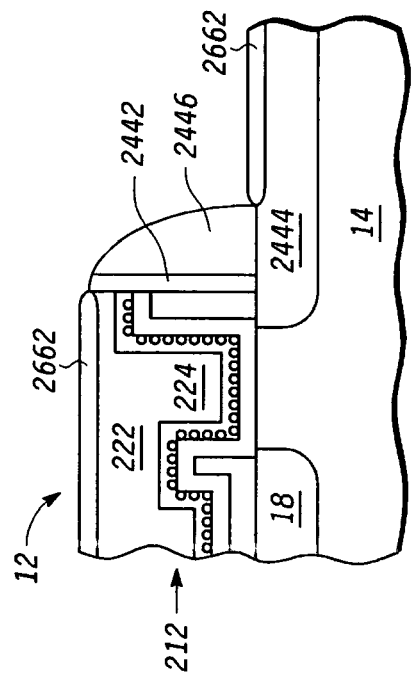
FIG. 24  FIG. 25
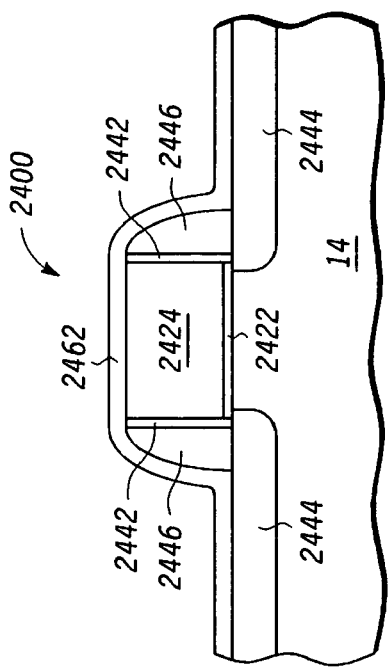
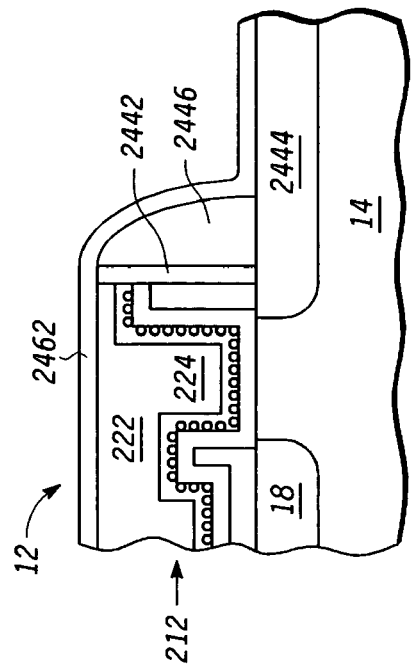
FIG. 26  FIG. 27

ELECTRONIC DEVICE INCLUDING AN ARRAY AND PROCESS FOR FORMING THE SAME

CROSS-REFERENCE TO RELATED APPLICATION

This application is a continuation-in-part and claims priority under 35 U.S.C. § 120 to U.S. patent application Ser. No. 10/961,295, entitled "A Virtual Ground Memory Array and Method Therefor" by Swift et al. filed Oct. 8, 2004, which is assigned to the current assignee hereof and incorporated herein by reference in its entirety.

BACKGROUND

1. Field of the Disclosure

The present invention relates to virtual ground memory arrays (VGAs), and more particularly, to VGAs with enhanced separation between source/drain and word line.

2. Description of the Related Art

Virtual ground memory arrays (VGAs) are particularly useful because they are very high density with their preferred usage being in non-volatile memories. VGAs do not require field isolation but require control of both the source and drain of the memory transistors that serve as memory elements. The VGA type memory is widely applicable to the various types of non-volatile memories, such as read-only memories ("ROMs"), programmable read-only memories ("PROMs"), one-time programmable read-only memories ("OT-PROMs"), flash, electrically programmable read-only memories ("EPROMs"), and electrically erasable and programmable read-only memories ("EEPROMs"). The VGA is also applicable to different storage mediums such as floating gate and nitride. One characteristic of VGAs is that the word line, which functions as the gate of the transistors for a given row of memory transistors, passes over the sources and drains. Although this is useful in achieving the high density of memory elements of VGAs, this also increases the capacitance between the word line (gate) and the drain. This is also sometimes called the Miller capacitance. The gate/drain capacitance, however, is preferably low.

One of the techniques in the past to reduce the gate/drain capacitance has been to grow an oxide layer over the sources and drains to provide increased separation between the gate and drain, thereby reducing gate/drain capacitance. While this is an effective approach for reducing the capacitance, it also introduces additional difficulties. The oxide growth has the effect of lowering the source/drains below the top surface of the silicon because the oxidation process involves using the substrate silicon in forming the oxide. This in turn causes what is known as a bird's beak similar to that found in local oxidation of silicon ("LOCOS") type isolation. The bird's beak has the effect of increasing the gate dielectric thickness at the edge of the gate where the sources and drains are. This is difficult to control and alters the operation of the memory transistor. Another problem with the oxide growth approach is that the temperature and time for performing this growth causes additional diffusion of the source/drain regions. Also this bird's beak has not changed much as the processing and lithography technology has improved to make transistors smaller. Thus the deleterious effect of the bird's beak actually gets more significant as the technology has improved and the transistors get smaller.

BRIEF DESCRIPTION OF THE DRAWINGS

The invention is illustrated by way of example and not limitation in the accompanying figures.

FIGS. 5 and 6 include illustrations of a top view and a cross-sectional view, respectively, of the substrate of FIGS. 3 and 4 after forming another insulating layer over the substrate.

FIGS. 7 and 8 include illustrations of a top view and a cross-sectional view, respectively, of the substrate of FIGS. 5 and 6 after removing portions of the insulating layers overlying the spaced-apart first insulating features.

FIGS. 24 and 25 include illustrations of cross-sectional views of the substrate after forming a transistor structure within a peripheral portion of an electronic device, sidewall spacers, and a metal-containing layer over the substrate.

FIGS. 26 and 27 include illustrations of cross-sectional views of the substrate of FIGS. 24 and 25 after forming silicide regions and removing unreacted portions of the metal-containing layer.

Figure 1:
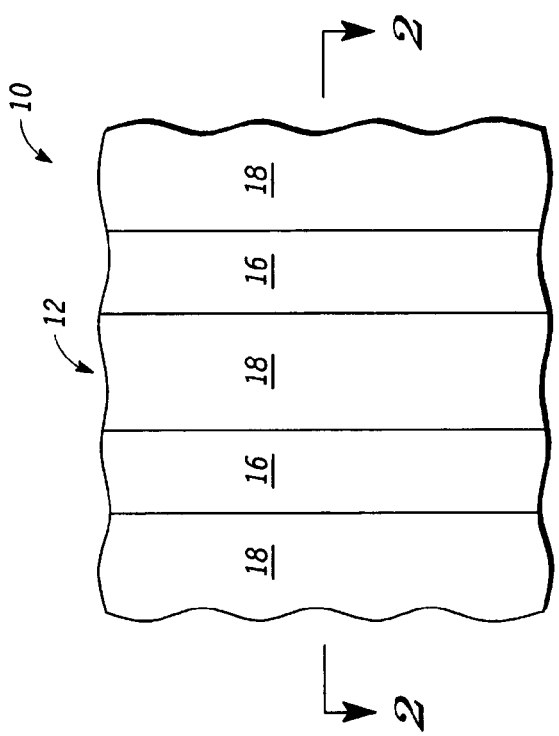
FIGS. 1 and 2 include illustrations of a top view and a cross-sectional view, respectively, of a portion of a workpiece after forming spaced-apart first insulating features and doped regions within a substrate.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include an NVM array, wherein portions of word lines are formed within trenches. Insulating features are formed over heavily doped regions within the substrate. In one embodiment, charge storage stacks and a control gate electrode layer can be formed and substantially fill the trench. The insulating features help to reduce capacitive coupling between the heavily doped regions and the control gate electrode layer. In a particular embodiment, the insulating features are recessed from a top surface of a layer outside the trenches. In this manner, the control gate electrode layer can form a substantially continuous electrical path along the lengths of the word lines. This particular embodiment substantially eliminates the formation of stringers or other residual etching artifacts from the control gate electrode layer within the array. In another embodiment, a process can be performed to form the electronic device In a first aspect, an electronic device can include a substrate and an array. The array can include spaced-apart first insulating features over the substrate and a second insulating feature overlying the substrate and lying between the spaced-apart first insulating features. A top surface of the second insulating feature may lie at a lower elevation compared to a top surface of the spaced-apart first insulating features. The array can also include a charge storage stack overlying the second insulating feature and lying between the spaced-apart first insulating features. The array can further include a control gate electrode overlying the charge storage stack and the second insulating feature and lying between the spaced-apart first insulating features.

In one embodiment of the first aspect, within the array, the charge storage stack and the control gate electrode do not overlie the spaced-apart first insulating features. In another embodiment, within the array, the charge storage stack does not overlie the spaced-apart first insulating features, and the control gate electrode includes a portion that overlies at least one of the spaced-apart first insulating features.

In still another embodiment of the first aspect, the electronic device further includes spaced-apart doped regions within the substrate. One of the space-apart doped regions is a first source/drain region for a non-volatile memory cell, and another of the space-apart doped regions is a second source/drain region for the non-volatile memory cell. A channel region lies within the substrate between the first and second source/drain regions. The charge storage stack overlies the channel region and portions of the first and second source/drain regions. The control gate electrode overlies the channel region and the portions of the first and second source/drain regions. In a particular embodiment, the charge storage stack contacts the substrate.

In a further embodiment of the first aspect, the control gate electrode includes polysilicon. In a particular embodiment, the control gate electrode further includes a metal-containing layer. In a still further embodiment, the spaced-apart first insulating features include an oxide, and the second insulating feature includes a nitride. In yet a father embodiment, from a cross-sectional view, the second insulating feature is substantially U-shaped, a first portion the second insulating feature below the control gate electrode has a first height, and a second portion of the second insulating feature not covered by the control gate electrode has a second height that is greater than the first height. In another embodiment, the charge storage stack includes nanocrystals.

In a second aspect, a process for forming an electronic device an array can include forming spaced-apart first insulating features over a substrate, and forming a second insulating feature over the substrate and lying between the spaced-apart first insulating features. A top surface of the second insulating feature may lie at a lower elevation compared to a top surface of the spaced-apart first insulating features. The process can also include forming a charge storage stack overlying the second insulating feature and lying between the spaced-apart first insulating features. The process can still further include forming a control gate electrode overlying the charge storage stack and the second insulating feature and lying between the spaced-apart first insulating features.

In one embodiment of the second aspect, forming the second insulating feature includes depositing a first layer over the substrate including over and between the spaced-apart first insulating features and depositing a second layer over the first layer, wherein the second layer has a different composition compared to the first layer. Forming the second insulating feature further includes removing portions of the second layer that overlie the spaced-apart first portions and removing portions of the first layer to lower a top surface of the first layer below the top surface of the spaced-apart first insulating features. In a particular embodiment, the process further includes removing remaining portions of the second layer before forming the charge storage stack.

In another particular embodiment of the second aspect, the process further includes removing portions of the first layer overlying the spaced-apart first insulating features before removing portions of the first layer to lower the top surface of the first layer. In a more particular embodiment, removing portions of the second layer includes polishing the second layer, removing portions of the first layer overlying the spaced-apart first insulating features includes polishing the first layer, and removing portions of the first layer to lower a top surface of the first layer includes etching the portions first layer that lie between the spaced-apart first insulating features.

In still another particular embodiment of the second aspect, removing portions of the first layer is performed such that second insulating feature has a height that is in a range of approximately 20 to approximately 80% of a height of the spaced-apart first insulating features. In yet another particular embodiment, the process further includes forming doped regions between the spaced-apart first insulating features before depositing the first layer.

In still another embodiment of the second aspect, forming the control gate electrode includes forming a control gate electrode layer over the substrate and polishing the control gate electrode layer to remove portions of the control gate electrode layer overlying the spaced-apart first insulating features. In a particular embodiment, the process further includes polishing the charge storage stack to remove portions of the charge storage stack overlying the spaced-apart first insulating features. In a further embodiment, forming the control gate electrode includes forming a control gate electrode layer over the substrate, forming a mask over the control gate electrode layer to define exposed portions of the control gate electrode layer, and etching the exposed portions of the control gate electrode layer to define the control gate electrode, wherein a portion of the control gate electrode overlies at least one of the spaced-apart first insulating features after etching is completed.

In a third aspect, an electronic device can include a substrate, a doped region within the substrate, a charge storage stack overlying the substrate, a first gate electrode layer overlying the charge storage stack, an insulating layer overlying the doped region and adjacent to the first gate electrode layer, and a second gate electrode layer overlying the insulating layer and contacting the first gate conductor.

In one embodiment of the third aspect, the doped region is part of a bit line for a memory array. In another embodiment, the first gate electrode layer includes polysilicon. In a particular embodiment, the second gate electrode layer includes a metal-containing material.

In still another embodiment of the third aspect, the first and second gate electrode layers are part of a word line in a memory. In a further embodiment, the electronic device includes a virtual ground array. In still a further embodiment, the charge storage stack includes a second insulating layer on the substrate, a charge storage layer on the second insulating layer, and a third insulating layer on the charge storage layer. In a particular embodiment, the charge storage layer includes a nitride or nanocrystals.

In a fourth aspect, a process for forming an electronic device can include implanting a doped region into the substrate, forming a charge storage stack over a substrate, forming a first gate electrode layer over the charge storage stack, forming an insulating layer over the charge storage stack and adjacent to the first gate electrode layer, and forming a second gate electrode layer over the insulating layer and contacting the first gate conductor.

In one embodiment of the fourth aspect, forming the charge storage stack includes forming a second insulating layer on the substrate, forming a charge storage layer on the second insulating layer, and forming a third insulating layer on the charge storage layer. In another embodiment, implanting the doped region includes forming an insulating layer on the substrate, patterning the insulating layer, and implanting the doped region. In still another embodiment, the insulating layer includes a nitride. In a further embodiment, the insulating layer is formed from TEOS. In still a further embodiment, the process further includes removing the charge storage stack from above the doped region.

Before addressing details of embodiments described below, some terms are defined or clarified. Group numbers corresponding to columns within the Periodic Table of the elements use the "New Notation" convention as seen in the *CRC Handbook of Chemistry and Physics*, 81$^{st}$ Edition (2000).

The term "stack" is intended to mean a plurality of layers or a plurality of at least one layer and at least one structure (e.g., nanocrystals), wherein the plurality of layers or plurality of layer(s) and structure(s) provides an electronic function. For example, a non-volatile memory stack can include layers used to form at least part of a non-volatile memory cell. A stack may be part of a larger stack. For example, a non-volatile memory stack can include a charge storage stack that is used to store charge within a non-volatile memory cell.

The term "substrate" is intended to mean a base material. An example of a substrate includes a quartz plate, a monocrystalline semiconductor wafer, a semiconductor-on-insulator wafer, etc. The reference point for a substrate is the beginning point of a process sequence.

The term "workpiece" is intended to mean a substrate and, if any, one or more layers one or more structures, or any combination thereof attached to the substrate, at any particular point of a process sequence. Note that the substrate may not significantly change during a process sequence, whereas the workpiece significantly changes during the process sequence. For example, at the beginning of a process sequence, the substrate and workpiece are the same. After a layer is formed over the substrate, the substrate has not changed, but now the workpiece includes the combination of the substrate and the layer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

Figure 2:
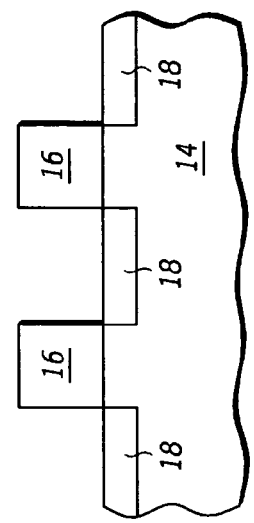

FIGS. 1 and 2 include illustrations of a top view and a cross-sectional view of a portion of a substrate 14 during the fabrication of an electronic device 10, such as an integrated circuit. The integrated circuit can be a standalone memory, a microcontroller, or other integrated circuit that includes a memory. In one embodiment, the electronic device 10 can include a non-volatile memory ("NVM") array 12, a portion of which is illustrated in FIGS. 1 and 2. The NVM array 12 can include one or more virtual ground arrays.

The substrate 14 can include a monocrystalline semiconductor wafer, a semiconductor-on-insulator wafer, a flat panel display (e.g., a silicon layer over a glass plate), or other substrate conventionally used to form electronic devices. Although not illustrated, shallow trench field isolation may be formed over portions of the substrate 14 in peripheral areas, which are outside the NVM array 12. A protective layer can be formed over the substrate 14. The protective layer is removed from at least portions the NVM array 12, thus leaving the protective layer over the peripheral areas of the electronic device 10. In one embodiment, the protective layer includes an oxide layer overlying the substrate 14 and a nitride layer over the oxide layer. The protective layer will remain over the peripheral areas until fabrication of the NVM array 12 is substantially completed.

Within the NVM array 12, spaced-apart first insulating features 16 are formed. The spaced-apart first insulating features 16 can be formed by depositing and patterning an insulating layer using conventional techniques. The insulating layer can be an oxide, a nitride, or a combination thereof. In one particular embodiment, the insulating layer includes $SiO_2$ formed by the thermal decomposition of tetraethylorthosilicate ("TEOS"). The spaced-apart first insulating features 16 have a thickness in a range of approximately 500 to approximately 3000 nm. At this point in the process, the spaced-apart first insulating features 16 are in the shape of strips having lengths that extend in a vertical direction, as illustrated in FIG. 1.

A dopant is introduced into the exposed portions of the substrate 14 between the spaced-apart first insulating features 16 to form source/drain ("S/D") regions 18 within the NVM array 12. The dopant may be a p-type dopant (e.g., boron) or an n-type dopant (e.g., phosphorus or arsenic). In one embodiment, the dopant can be introduced using ion implantation. An optional thermal cycle can be performed to activate the dopant. In another embodiment, subsequent processing may have one or more thermal cycles capable of activating the dopant. At the primary surface of the substrate 14, the doping concentration of the S/D regions 18 is at least approximately 1E19 atoms/cm$^3$. Although not illustrated, an implant screen (e.g., a silicon dioxide or silicon nitride layer having a thickness no greater than 20 nm) may be formed introducing the dopant into the substrate. The implant screen can help to reduce the likelihood of implant channeling.

Figure 3:
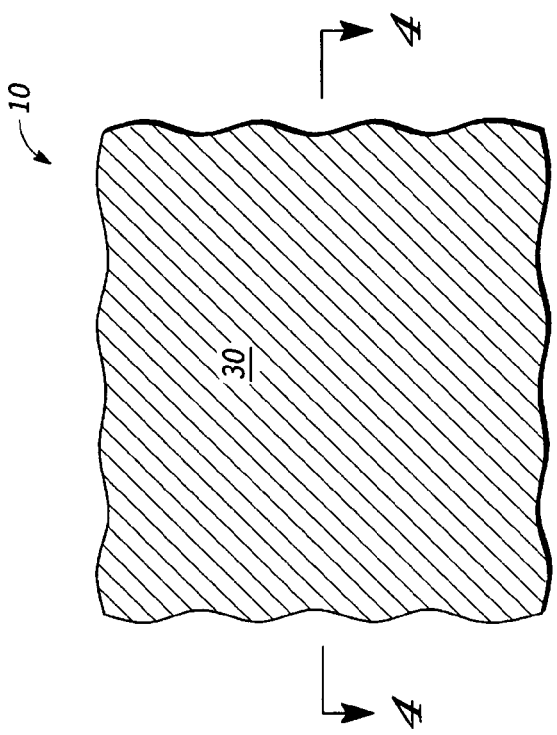
FIGS. 3 and 4 include illustrations of a top view and a cross-sectional view, respectively, of the substrate of FIGS. 1 and 2 after forming an insulating layer over the spaced-apart first insulating features and doped regions.
Figure 4:
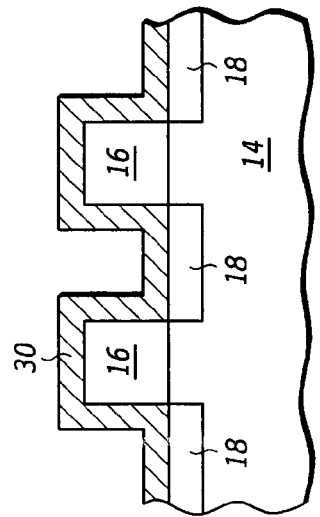

An insulating layer 30 is formed over the substrate 14, the spaced-apart first insulating features 16, and S/D regions 18, as illustrated in FIGS. 3 and 4. In one embodiment, the insulating layer 30 is formed by depositing a material that is different from the material within the spaced-apart first insulating features 16. For example, the insulating layer 30 can include a nitride if the spaced-apart first insulating features 16 include an oxide. The thickness of the insulating layer 30 may only partly fill the gaps between the spaced-apart first insulating features 16. The insulating layer 30 helps to reduce capacitive coupling between the S/D regions 18 and the subsequently-formed word lines. In a particular embodiment, the insulating layer 30 has a thickness that is in a range of approximately 10% to approximately 50% of the height of the spaced-apart first insulating features 16.

Another insulating layer 50 is formed over the insulating layer 30, as illustrated in FIGS. 5 and 6. In one embodiment, the insulating layer 50 is formed by depositing a material that is different from the material within the insulating layer 30. For example, the insulating layer 50 can include an oxide if the insulating layer 30 includes a nitride. The thickness of the insulating layer 50 fills the remaining portions of the gaps between the spaced-apart first insulating features 16. In a particular embodiment, the insulating layer 50 has a thickness that is at least approximately the height of the spaced-apart first insulating features 16.

Portions of the insulating layer 50 over the spaced-apart first insulating features 16 are removed, as illustrated in FIGS. 7 and 8. In one embodiment, the portions of the insulating layer are removed by chemical mechanical polishing using a conventional technique. In another embodiment, the insulating layer 50 is deposited until its upper surface is nearly flat, and the insulating layer 50 is etched until the insulating layer 30 is exposed. In another embodiment, a conventional resist etch back process can be used until the insulating layer 30 is exposed. The etch to remove portions of the insulating layer 50 may be performed isotropically or anisotropically. Portions of the insulating layer 30 overlying the spaced-apart first insulating features 16 are removed to form second insulating features 72 that lie between the spaced-apart first insulating features and are substantially U-shaped within the NVM array 12. The portions of the insulating layer 30 overlying the spaced-apart first insulating features 16 may be removed using a conventional polishing or etch process.

Figure 9:
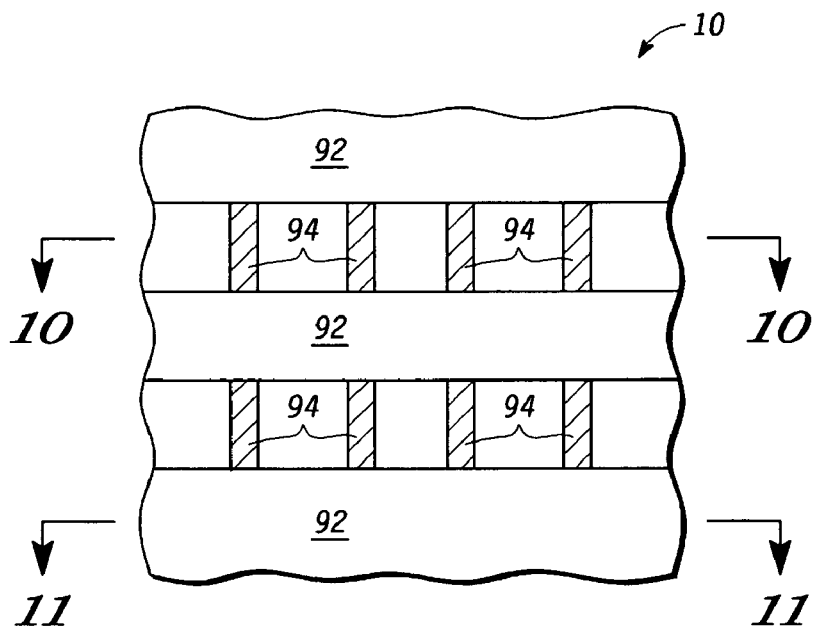
FIGS. 9 to 11 include illustrations of top and cross-sectional views of the substrate of FIGS. 7 and 8 after recessing portions of second features at locations where word lines will be subsequently formed.
Figure 10:
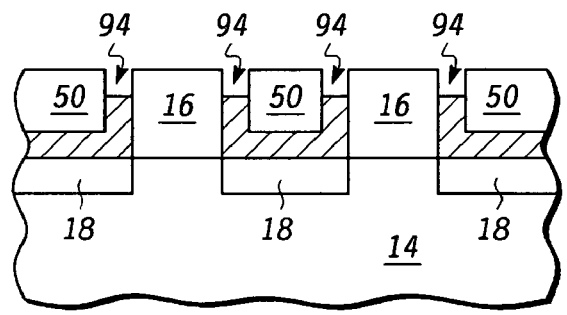
Figure 11:
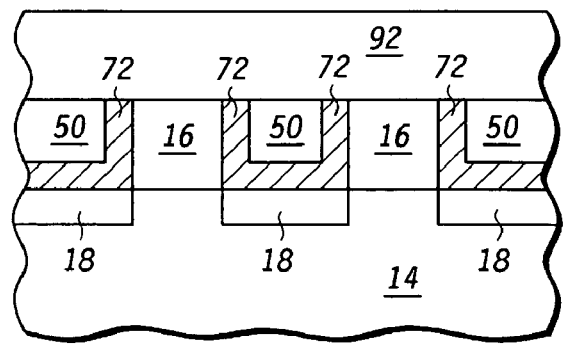

A mask 92 is formed over the substrate 14 including portions of the NVM array 12, as illustrated in FIGS. 9 to 11. The mask 92 corresponds to an inverse image of the subsequently formed word lines within the NVM array 12. Therefore, exposed portions of the insulating layer 50, second insulating features 72, and spaced-apart first insulating features 16 correspond to word line locations, and masked portions of the insulating layer 50, second insulating features 72, and spaced-apart first insulating features 16 correspond to portions of the NVM array 12 between word line locations.

Exposed portions of the second insulating features 72 at word line locations are removed to recess the height of the second insulating features 72 and give recessed portions 94 of the second insulating features 72, as illustrated in FIG. 9.

Each of the recessed portions 94 of the second insulating features 72 has a height that is in a range of approximately 20% to approximately 80% of a height of the spaced-apart first insulating features 16. In one embodiment, the second insulating features 72 include nitride and the insulating layer 50 and spaced-apart first insulating features 16 include oxide. A conventional nitride etch can be performed to remove portions of the second insulating features 72. The etch may be performed anisotropically. The mask 92 covers the insulating layer 50, second insulating features 72, and spaced-apart first insulating features 16 at locations outside of the word line locations, as illustrated in FIG. 11.

Figure 12:
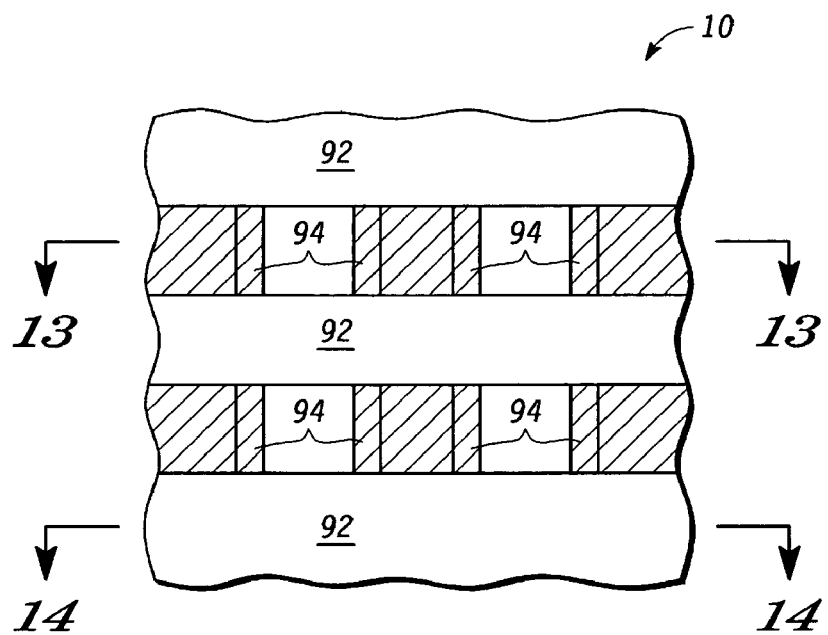
FIGS. 12 to 14 include illustrations of top and cross-sectional views of the substrate of FIGS. 9 to 11 after portions of oxide layers at locations where word lines will be subsequently formed.
Figure 13:
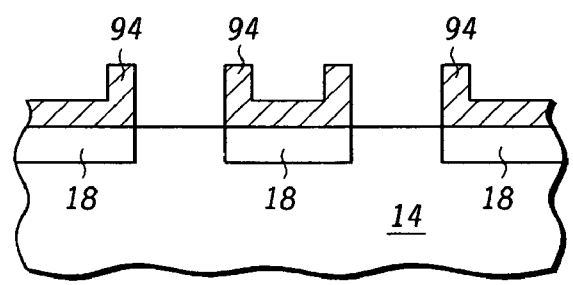
Figure 14:
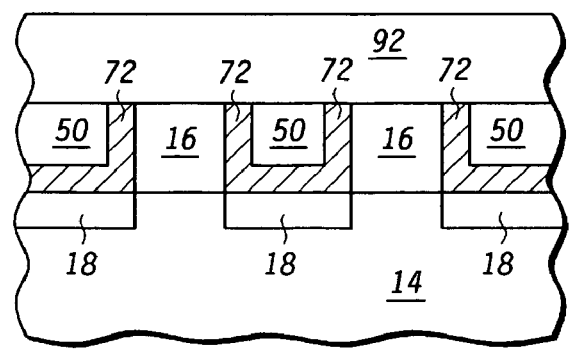

Portions of the insulating layer 50 and spaced-apart first insulating features 16 at the word line locations are removed to expose portions of the second insulating features 72, including the recessed portions 94, and portions of the substrate 14 at word line locations, as illustrated in FIGS. 12 and 13. The etch can be performed using a conventional anisotropic etching technique. The etch may be timed or may use endpoint detection, based on reaching the second insulating features 72 (e.g., nitride), and substrate 14 (e.g., silicon), or both. An optional timed overetch may be used to account for nonuniform etching across the surface of the substrate 14. The mask 92 covers the insulating layer 50, second insulating features 72, and spaced-apart first insulating features 16 at locations outside of the word line locations, as illustrated in FIG. 14. At this point in the process, the spaced-apart first insulating features 16 are no longer strips that extend vertically in FIG. 12, but are discrete rectilinear blocks lying between word line locations. Similarly, remaining portions of the insulating layer 50 are discrete rectilinear blocks lying between word line locations. In one embodiment, the second insulating features 72 are strips that have lengths that extend vertically in FIG. 12; however, the second insulating features 72 have the recessed portions at word line locations. The mask 92 is removed using a conventional ashing technique.

Figure 15:
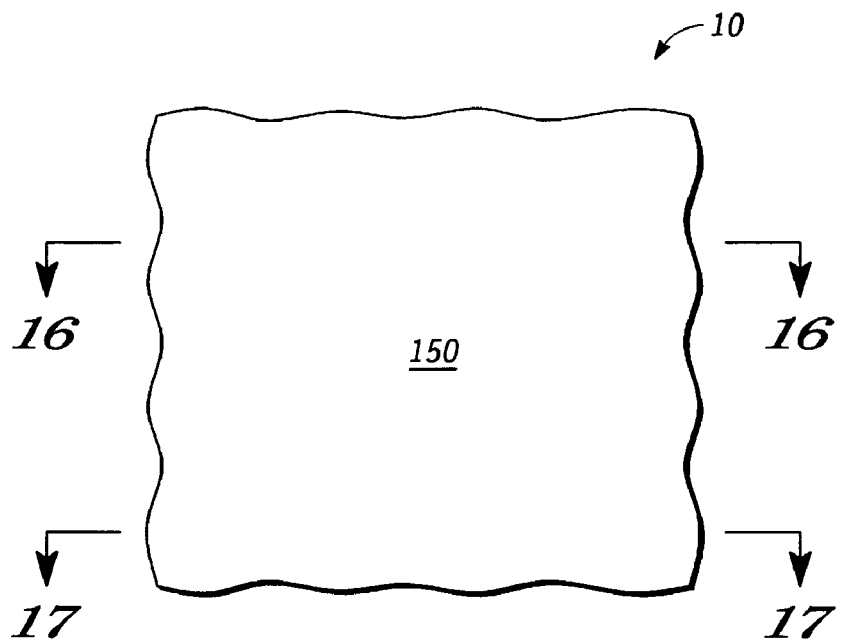
FIGS. 15 to 17 include illustrations of top and cross-sectional views of the substrate of FIGS. 12 to 14 after forming a charge storage stack over the substrate.
Figure 16:
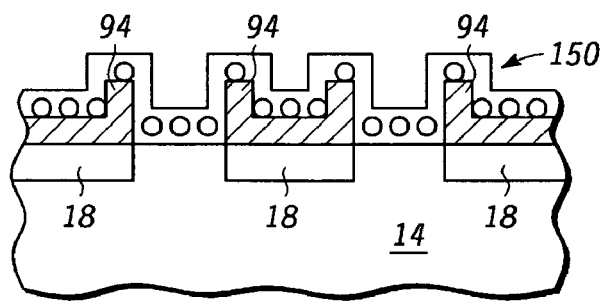
Figure 17:
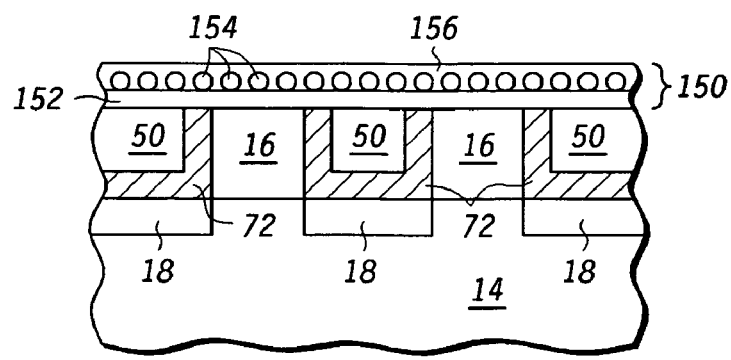

A charge storage stack 150 is formed over the substrate, as illustrated in FIGS. 15 to 17. The charge storage stack 150 includes a first gate dielectric layer 152, a charge storage layer 154, and, an interlevel dielectric layer 156. In one embodiment, the gate dielectric layer 152 is a tunnel oxide that allows Fowler-Nordheim tunneling to be used for programming the NVM array 12, erasing the NVM array 12, or both. The gate first dielectric layer 152 may be thermally grown using an ambient, including oxygen, or deposited using a conventional chemical vapor deposition technique, physical vapor deposition technique, atomic layer deposition technique, or a combination thereof. If the first gate dielectric layer 152 is thermally grown, it is not formed outside the word line locations. If the first gate dielectric layer 152 is deposited, it is deposited over substantially all of the substrate 14. The first gate dielectric layer 152 can include one or more films of silicon dioxide, silicon nitride, silicon oxynitride, a high-k material (e.g., k greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. The first gate dielectric layer 152 has a thickness in a range of approximately 2 to approximately 20 nm.

The charge storage layer 154 is formed by depositing nanocrystals (also called discontinuous storage elements or quantum dots) over the gate dielectric layer 152. The charge storage layer 154 can include a material capable of storing a charge, such as polysilicon, amorphous silicon, a nitride, or a metal-containing material. The charge storage layer 154 may be undoped, doped during deposition, or doped after deposition. In one embodiment, the charge storage layer 154 includes nanocrystals that are no greater than approximately 10 nm in any dimension. In another embodiment, the nanocrystals can be larger, however, the nanocrystals are not formed so large as to form a continuous structure (i.e., nanocrystals are not fused together).

The interlevel dielectric layer 156 can include one or more dielectric films, any of which may be thermally grown or deposited. The interlevel dielectric layer 156 can include silicon dioxide, silicon oxynitride, an oxide-nitride-oxide stack, or a high-k dielectric material, or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. In one embodiment, the interlevel dielectric layer 156 is formed by a conventional deposition technique (e.g., chemical of physical vapor deposition). In one embodiment, the thickness of the interlevel dielectric layer 156 is in a range of approximately 1 to approximately 20 nm.

Figure 18:
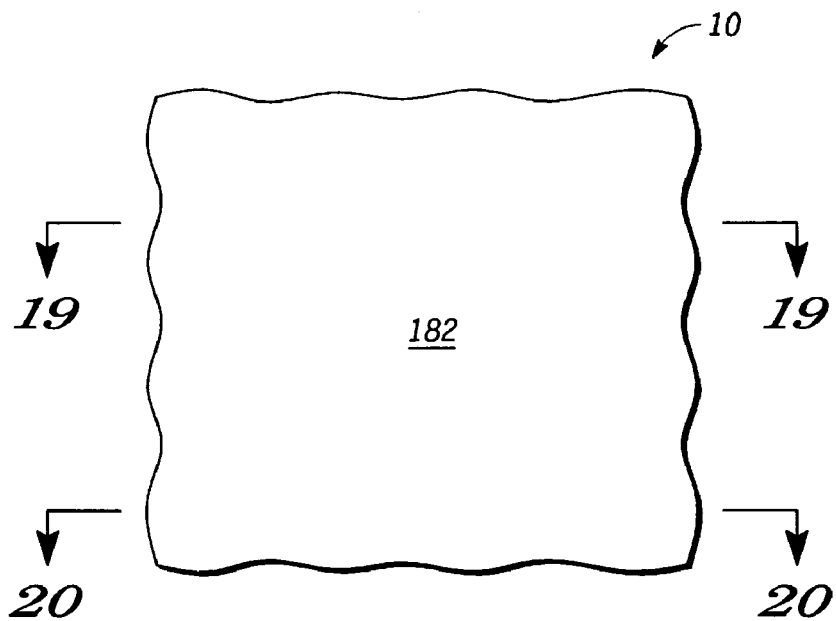
FIGS. 18 to 20 include illustrations of top and cross-sectional views of the substrate of FIGS. 15 and 17 after forming a first gate electrode layer over the substrate.
Figure 19:
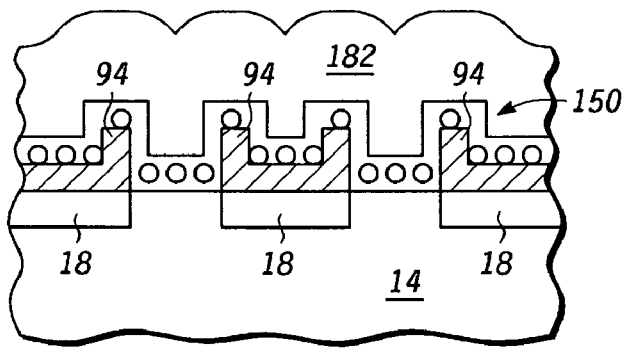
Figure 20:
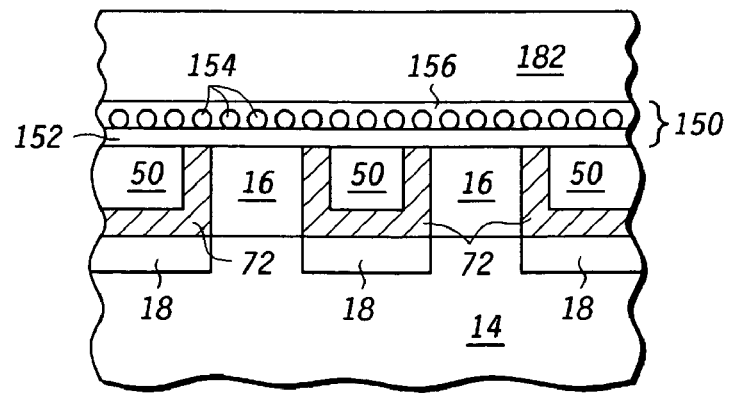

A gate electrode layer 182 is deposited over substantially all of the substrate 14, as illustrated in FIGS. 18 to 20. The gate electrode layer 182 can include one or more semiconductor-containing or metal-containing films. In one embodiment, the gate electrode layer 182 includes polysilicon or amorphous silicon deposited by a chemical vapor deposition process, but may include other materials or may be deposited by other processes in other embodiments. In one embodiment, the gate electrode layer 182 is doped when deposited, and in another embodiment, is doped after it is deposited. The thickness of the gate electrode layer 182 is sufficient to at least approximately fill in the gaps between the spaced-apart first insulating features 16 and remaining portions of the insulating layer 50 at word line locations within the NVM array 12. In one embodiment, the thickness of the gate electrode layer 182 is in a range of approximately 50 to approximately 300 nm, and in a finished device, the gate electrode layer 182 has a dopant concentration of at least 1E19 atoms/cm$^3$ when the gate electrode layer 182 includes polysilicon or amorphous silicon.

Figure 21:
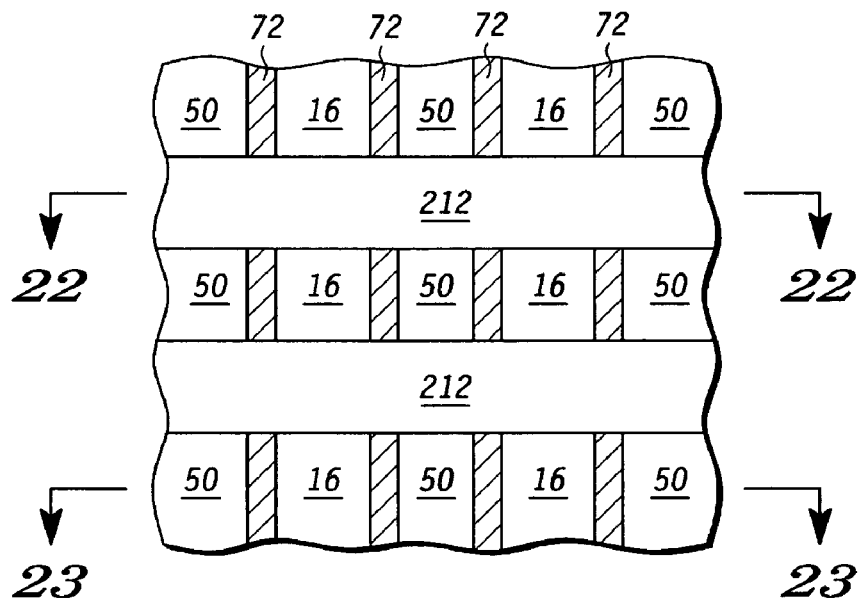
FIGS. 21 to 23 include illustrations of top and cross-sectional views of the substrate of FIGS. 18 and 20 after removing portions of the first gate electrode layer to form word lines.
Figure 22:
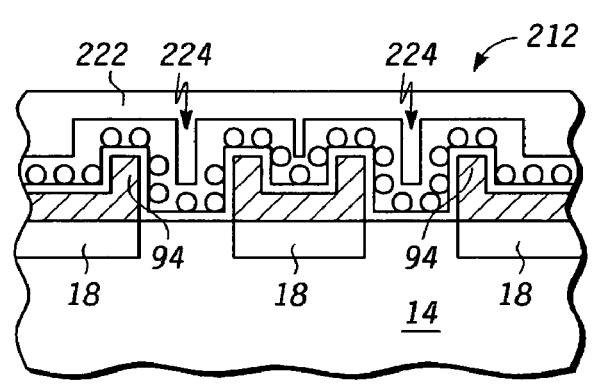
Figure 23:
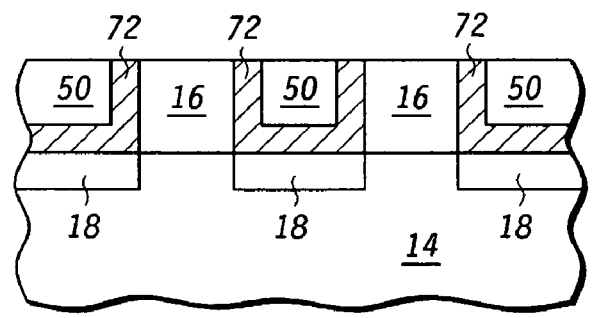

Portions of the gate electrode layer 182 and charge storage stack 150 are removed to form word lines 212 at the word line locations in FIGS. 21 to 23. In one embodiment, the portions of the gate electrode layer 182 lying outside of the word line locations are removed by a conventional polishing technique that stops on the spaced-apart first insulating features 16 and remaining portions of the insulating layer 50 at locations outside the word line locations. The word lines 212 include a plurality of gate electrode portions 224 and reduced-thickness portions 222, which overlie the recessed portions of the second insulating features 72. In one embodiment, the reduced-thickness portions 222 have a thickness (as measured from the reduced portions 94 of the second insulating features 72 to the top of the word line 212, as illustrated in FIG. 22) that is approximately 10% to approximately 80% of the thickness of the gate electrode portions 224 (as measured from the charge storage stack 150 between the spaced-apart first insulating features 16 to the top of the word line 212, as illustrated in FIG. 22). In another embodiment, the reduced thickness portions 222 have a thickness in a range of approximately 20 to approximately 100 nm. The word lines 212 form a continuous conduction path along their lengths. Because the word lines 212 are not etched along deep portions of openings, the likelihood of electrical shorts or leakage paths between adjacent word lines 212 is substantially eliminated.

In another embodiment, a conventional lithographic process can be used. An optional anti-reflective layer (not illustrated) can include one or more nitride-containing films that are deposited over the gate electrode layer 182. In one embodiment, the optional anti-reflective layer includes silicon nitride, silicon-rich silicon nitride, a silicon oxynitride, a metal-containing nitride (e.g., TiN), a metal-containing oxynitride (e.g., $Ti_aO_bN_c$), a metal-silicon nitride (e.g., $Ta_aSi_bN_c$), a metal-silicon oxynitride (e.g., $Ta_aSi_bO_cN_d$), or any combination thereof. The optional anti-reflective layer can be deposited by a chemical or physical vapor deposition process.

A mask (not illustrated) can be formed over the word line locations. Within the NVM array 12, the mask is nearly the inverse image of the mask 92. The mask corresponding to the word line locations may be slightly oversized to allow for some process margin. Exposed portions of the optional anti-reflective layer and the gate electrode layer 182 are removed by a conventional anisotropic etching technique. The etch may be timed or may use endpoint detection, based on reaching the spaced-apart first insulating features 16 and remaining portions of the insulating layer 50, or both. An optional timed overetch may be used to account for nonuniform etching across the surface of the substrate 14. The word lines 212 may partly overlie the spaced-apart first insulating features 16 and remaining portions of the insulating layer 50, or both at locations immediately adjacent to edges of the spaced-apart first insulating features 16 and remaining portions of the insulating layer 50. Because the word lines 212 are not etched along deep portions of openings, the likelihood of electrical shorts or leakage paths between adjacent word lines 212 is substantially eliminated. The mask is removed using a conventional ashing technique.

At this point in the process, the NVM array 12 is substantially completed. The protective layer (not illustrated) of the peripheral areas of the substrate 14 is removed, and another protective layer (not illustrated) is formed over the NVM array 12 to protect the NVM array during component fabrication within the peripheral areas.

A gate dielectric layer 2422 and a gate electrode layer 2424 are formed over the substrate 14, as illustrated in FIG. 24. The gate dielectric layer 2422 and gate electrode layer 2424 can include any one or more materials and have thicknesses, as those described above for the gate dielectric layer 152 and gate electrode layer 182, respectively. The gate dielectric layer 2422 may have the same or different composition and same or different thickness as compared to the gate dielectric layer 152, and the gate electrode layer 2424 may have the same or different composition and same or different thickness as compared to the gate electrode layer 182.

In another embodiment, an optional anti-reflective layer (not illustrated) can be used and include one or more nitride-containing films that are deposited over the gate electrode layer 2424. In one embodiment, the optional anti-reflective layer includes silicon nitride, silicon-rich silicon nitride, a silicon oxynitride, a metal-containing nitride (e.g., TiN), a metal-containing oxynitride (e.g., $Ti_aO_bN_c$), a metal-silicon nitride (e.g., $Ta_aSi_bN_c$), a metal-silicon oxynitride (e.g., $Ta_aSi_bO_cN_d$), or any combination thereof. The optional anti-reflective layer can be deposited by a chemical or physical vapor deposition process.

A conventional patterning technique is used to form the gate electrode layer 2424, as illustrated in FIG. 24. Other gate electrodes similar to the one illustrated are also formed from the gate electrode layer 2424, but are not illustrated in FIG. 24. The protective layer overlying the NVM array 12 can be removed.

An insulating layer is formed over the substrate, including the NVM array 12 and peripheral areas. The insulating layer is formed by depositing a layer of oxide, nitride, oxynitride, or a combination thereof, such that the insulating layer overlies the second gate electrode layer 2424, the S/D regions 18, and is adjacent to the word lines 212, which includes the first gate electrodes layer 182. In one embodiment, the insulating layer is formed by depositing SiO2 using tetraethylorthosilicate ("TEOS"). The insulating layer is anisotropically etched to form first sidewall spacers 2442. The first sidewall spacers 2442 will be formed along substantially vertical surfaces over the substrate 14. Therefore, the first sidewall spacers 2442 lie along the second gate electrode layer 2424, as illustrated in FIG. 24, and laterally surround the NVM array 12, a portion of which is illustrated in FIG. 25.

A dopant is introduced into portions of the substrate 14 to form doped regions. The doped regions will become extension regions for transistors within the peripheral areas. The dopant may be a p-type dopant (e.g., boron) or an n-type dopant (e.g., phosphorus or arsenic). In one embodiment, the dopant can be introduced using ion implantation.

Another insulating layer is formed over the substrate, including the NVM array 12 and peripheral areas. The insulating layer is formed by depositing a layer of oxide, nitride, oxynitride, or a combination thereof, such that the insulating layer overlies the second gate electrode layer 2424, the S/D regions 18, and is adjacent to the word lines 212, which includes the first gate electrodes layer 182. In one embodiment, the insulating layer is formed by depositing a nitride layer. The insulating layer is anisotropically etched to form second sidewall spacers 2446. The second sidewall spacers 2446 will be formed along the outer surfaces of the first sidewall spacers 2442. Therefore, the sidewall spacers 2442 lie adjacent to the second gate electrode layer 2424, as illustrated in FIG. 24, and laterally surround the NVM array 12, a portion of which is illustrated in FIG. 25.

Another dopant is introduced into portions of the substrate 14 to form doped regions. The doped regions will become heavily doped portions of S/D regions 2444 for transistors within the peripheral areas. The dopant may be a p-type dopant (e.g., boron) or an n-type dopant (e.g., phosphorus or arsenic). In one embodiment, the dopant can be introduced using ion implantation.

An anneal is performed to activate the dopant from the implants to form S/D regions 2444 for transistors within the periphery and along edges of the NVM array 12. The S/D regions include extension regions and heavily doped regions, as previously described.

A metal-containing layer 2462 is formed over the substrate 14 as illustrated in FIGS. 24 and 25. The metal-containing layer 2462 can include a material capable of reacting with silicon to form a silicide, and can include Ti, Ta, Co, W, Mo, Zr, Pt, other suitable material, or any combination thereof. In one embodiment, the metal-containing layer 2462 is performed using a conventional deposition technique.

Exposed portions of the word line 212, which includes the gate electrode layer 182, the gate electrode layer 2424, and S/D regions 2444 react with the metal-containing layer 2462 to formed silicide regions 2662, as illustrated in FIGS. 26 and 27. Portions of the metal-containing layer 2462 that overlie insulating materials (e.g., oxide, nitride, oxynitride, etc.) do not significantly react with one another. Unreacted portions of the metal-containing layer 2462 are removed using a conventional technique. The silicide regions 2662 that overlie the word lines 212 and gate electrode layer 2424 can be considered a gate electrode layer because they can effectively be considered part of the gate electrodes for the transistors formed.

Processing can be continued to form a substantially completed electronic device. One or more insulating layers, one or more conductive layers, and one or more encapsulating layers are formed using conventional techniques.

In an alternative embodiment, the protective layer (not illustrated), which could be formed over the NVM array 12 while forming electronic components within the peripheral areas, and the optional anti-reflective layer (not illustrated), which could be formed over the gate electrode layer 2424, can include substantially the same material, such as silicon-rich silicon nitride. Before depositing the metal-containing layer 2426, the same etchant can be used to remove such protective layer and optional anti-reflective layer. Thus, one or more processing steps may be eliminated.

The NVM array 12 can be formed such that electrical shorts or leakage paths between adjacent word lines 212 are substantially prevented. More specifically, the word lines 212 can be formed without having to etch the first gate electrode layer 182 within deep openings. Within the NVM array 12, the spaced-apart first insulating features 16, remaining portions of the insulating layer 50, and portions of the second insulating features 72 between the word lines 212 substantially prevent any of the gate electrode layer 182 from being formed near the substrate 14. Therefore, polishing or etching of the gate electrode layer 182 is less likely to form a stringer or other conductors that extends between the word lines 212.

The embodiment, as illustrated and described, allows for an effective reduction in the word line 212 to S/D region 18 capacitance due to the second insulating features 72, and while achieving gate-to-channel uniformity. The process integration for the NVM array 12 has processing improvements and can reduce the geometries, such as channel lengths. Further, this is achieved while not requiring any extra masks than normally required for a VGA.

Within the NVM array 12, the memory transistors can be either single-bit cells or two-bit cells.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above disclosed subject matter is to be considered illustrative, and not restrictive, and the appended claims are intended to cover all such modifications, enhancements, and other embodiments which fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process for forming an electronic device, the process comprising:
    forming spaced-apart first insulating features over a substrate;
    forming a second insulating feature over the substrate and lying between the spaced-apart first insulating features, wherein a top surface of the second insulating feature lies at a lower elevation compared to a top surface of the spaced-apart first insulating features, wherein forming the second insulating feature comprises:
        depositing a first layer over the substrate including over and between the spaced-apart first insulating features;
        depositing a second layer over the first layer, wherein the second layer has a different composition compared to the first layer;
        removing portions of the second layer that overlie the spaced-apart first portions; and
        removing portions of the first layer to lower a top surface of the first layer below the top surface of the spaced-apart first insulating features;
    forming a charge storage stack overlying the second insulating feature and lying between the spaced-apart first insulating features; and
    forming a control gate electrode overlying the charge storage stack and the second insulating feature and lying between the spaced-apart first insulating features.

2. The process of claim 1, wherein from a cross-sectional view,
    the second insulating feature is substantially U-shaped;
    a first portion the second insulating feature below the control gate electrode has a first height; and
    a second portion of the second insulating feature not covered by the control gate electrode has a second height that is greater than the first height.

3. The process of claim 1, wherein the charge storage stack comprises nanocrystals.

4. The process of claim 1, further comprising removing remaining portions of the second layer before forming the charge storage stack.

5. The process of claim 1, further comprising removing portions of the first layer overlying the spaced-apart first insulating features before removing portions of the first layer to lower the top surface of the first layer.

6. The process of claim 5, wherein:
    removing portions of the second layer comprises polishing the second layer;
    removing portions of the first layer overlying the spaced-apart first insulating features comprises polishing the first layer; and
    removing portions of the first layer to lower a top surface of the first layer comprises etching the portions first layer that lie between the spaced-apart first insulating features.

7. The process of claim 1, wherein removing portions of the first layer is performed such that the second insulating feature has a height that is in a range of approximately 20% to approximately 80% of a height of the spaced-apart first insulating features.

8. The process of claim 1, further comprising forming doped regions between the spaced-apart first insulating features before depositing the first layer.

9. The process of claim 1, wherein forming the control gate electrode comprises:
    forming a control gate electrode layer over the substrate; and
    polishing the control gate electrode layer to remove portions of the control gate layer overlying the spaced-apart first insulating features.

10. The process of claim 9, further comprising polishing the charge storage stack to remove portions of the charge storage stack overlying the spaced-apart first insulating features.

11. The process of claim 1, wherein forming the control gate electrode comprises:
    forming a control gate electrode layer over the substrate;
    forming a mask over the control gate electrode layer to define exposed portions of the control gate electrode layer; and
    etching the exposed portions of the control gate electrode layer to define the control gate electrode, wherein a portion of the control gate electrode overlies at least one of the spaced-apart first insulating features after etching is completed.

* * * * *